United States Patent
Yang et al.

(10) Patent No.: US 10,431,595 B1
(45) Date of Patent: Oct. 1, 2019

(54) MEMORY DEVICES HAVING VERTICALLY EXTENDING CHANNEL STRUCTURES THEREIN

(71) Applicant: Samsung Electronics Co., Ltd., Suwon-si, Gyeonggi-do (KR)

(72) Inventors: Han Vit Yang, Hwaseong-si (KR); Yong Hoon Son, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/043,258

(22) Filed: Jul. 24, 2018

(30) Foreign Application Priority Data

Mar. 19, 2018 (KR) ........................ 10-2018-0031251

(51) Int. Cl.
*H01L 27/11582* (2017.01)
*H01L 27/11573* (2017.01)
*G11C 16/04* (2006.01)
*H01L 29/423* (2006.01)
*H01L 23/532* (2006.01)
*H01L 27/1157* (2017.01)

(52) U.S. Cl.
CPC .... *H01L 27/11582* (2013.01); *G11C 16/0466* (2013.01); *H01L 23/5329* (2013.01); *H01L 27/1157* (2013.01); *H01L 27/11573* (2013.01); *H01L 29/4234* (2013.01)

(58) Field of Classification Search
CPC ........... H01L 27/11582; H01L 27/1157; H01L 23/5329; H01L 27/11573; H01L 29/4234; G11C 16/0466

See application file for complete search history.

(56) References Cited

U.S. PATENT DOCUMENTS

| | | | |
|---|---|---|---|
| 8,187,936 B2 * | 5/2012 | Alsmeier | H01L 27/11551 257/324 |
| 9,576,971 B2 | 2/2017 | Zhang et al. | |
| 9,711,524 B2 | 7/2017 | Shoji et al. | |
| 9,716,099 B2 | 7/2017 | Choi | |
| 9,748,267 B2 | 8/2017 | Zhang et al. | |
| 10,283,525 B2 * | 5/2019 | Tsuji | H01L 27/11582 |
| 2013/0341701 A1 | 12/2013 | Blomme et al. | |
| 2017/0069653 A1 | 3/2017 | Naito et al. | |
| 2017/0110471 A1 | 4/2017 | Yoshimizu et al. | |
| 2017/0162594 A1 | 6/2017 | Ahn | |

* cited by examiner

*Primary Examiner* — David Vu
(74) *Attorney, Agent, or Firm* — Myers Bigel, P.A.

(57) ABSTRACT

A memory device includes a substrate having a first source film thereon and an upper stacked structure on the first source film. An electrically conductive channel structure is provided, which extends through the upper stacked structure and the first source film. The channel structure includes a channel pattern, which extends vertically through the upper stacked structure and the first source film, and an information storage pattern on a sidewall of the channel pattern. A second source film is provided, which extends between the first source film and a surface of the substrate. The second source film, which contacts the channel pattern, includes an upward extending protrusion, which extends underneath the information storage pattern. A channel protective film is provided, which extends between at least a portion of the protrusion and at least a portion of the information storage pattern.

20 Claims, 19 Drawing Sheets

US 10,431,595 B1

MEMORY DEVICES HAVING VERTICALLY EXTENDING CHANNEL STRUCTURES THEREIN

REFERENCE TO PRIORITY APPLICATION

This U.S. non-provisional patent application claims priority, under 35 U.S.C. § 119, to Korean Patent Application No. 10-2018-0031251, filed Mar. 19, 2018, the disclosure of which is hereby incorporated herein by reference in its entirety.

BACKGROUND

1. Field of the Invention

The present inventive concept relates to memory devices and, more particularly, to vertical memory devices, such as vertical nonvolatile memory devices.

2. Discussion of Related Art

Non-volatile memory devices including memory cells arranged in three dimensions have been proposed for high integration and reduction in the weight, width, length, and size of electronic products. When memory cells are formed, a channel structure passing through a stacked structure is required and a channel pattern of the channel structure needs to be in electrical contact with a substrate. In order to electrically connect the channel pattern of the channel structure to the substrate, a selective epitaxial growth (SEG) process can be used after a lower portion of the channel structure is etched. However, as the number of stacked memory cells increases, the SEG process may become exceptionally complex. Therefore, there have been attempts to use a technique in which an opening is formed in a side surface of a channel structure.

SUMMARY OF THE INVENTION

The present inventive concept is directed to providing a memory device having a channel protective film therein, which enables an etched surface of an information storage pattern to be controlled to be uniform when an opening is formed in a side surface of a channel structure.

In addition, the present inventive concept is directed to providing a memory device for preventing a problem of over-etching of an information storage pattern when an opening is formed in a side surface of a channel structure.

Further, the present inventive concept is directed to providing a method of manufacturing a memory device which controls the etching of an information storage pattern to be uniform when an opening is formed in a side surface of a channel structure.

A memory device according to an embodiment of the present inventive concept includes a lower stacked structure formed on a substrate and including a first source film and a second source film disposed below the first source film, an upper stacked structure disposed on the lower stacked structure, and a channel structure passing through the upper stacked structure and the first source film and including a channel pattern configured to extend downward and an information storage pattern disposed outside the channel pattern. The second source film is formed below the information storage pattern and is in contact with the channel pattern. The second source film includes a protrusion configured to extend upward, and a channel protective film is disposed on at least a portion between the protrusion and the information storage pattern.

A method of manufacturing a memory device according to an embodiment of the present inventive concept includes: forming a lower stacked structure including a first source film on a substrate, forming an upper stacked structure, in which an insulating layer and a sacrificial layer are alternately disposed, on the lower stacked structure, forming a channel structure passing through the upper stacked structure and the first source film and including a channel pattern and an information storage pattern, forming a word line cut passing through the first source film and configured to expose side surfaces of the insulating layer and the sacrificial layer, etching a portion of the information storage pattern through the word line cut, forming a channel protective film on a portion in which the information storage pattern is removed, exposing the channel pattern by etching a portion of the channel protective film, and forming a second source film in contact with the first source film and the channel pattern.

A memory device according to an embodiment of the present inventive concept includes a lower stacked structure formed on a substrate and including a first source film and a second source film disposed below the first source film, an upper stacked structure disposed on the lower stacked structure, and a channel structure passing through the upper stacked structure and the first source film and including a channel pattern configured to extend downward and an information storage pattern disposed outside the channel pattern. The second source film is formed below the information storage pattern and is in contact with the channel pattern. The second source film includes a protrusion configured to extend upward. A channel protective film is disposed between the protrusion and the information storage pattern. The channel protective film may be formed below a blocking layer and a charge storage layer of the information storage pattern, and a lower end of the channel protective film may be located at the same level as a lower end of a tunnel insulation layer of the information storage pattern. An upper end of the protrusion may be located at a lower level than an upper end of the first source film.

DETAILED DESCRIPTION OF EXEMPLARY EMBODIMENTS

Figure 1:
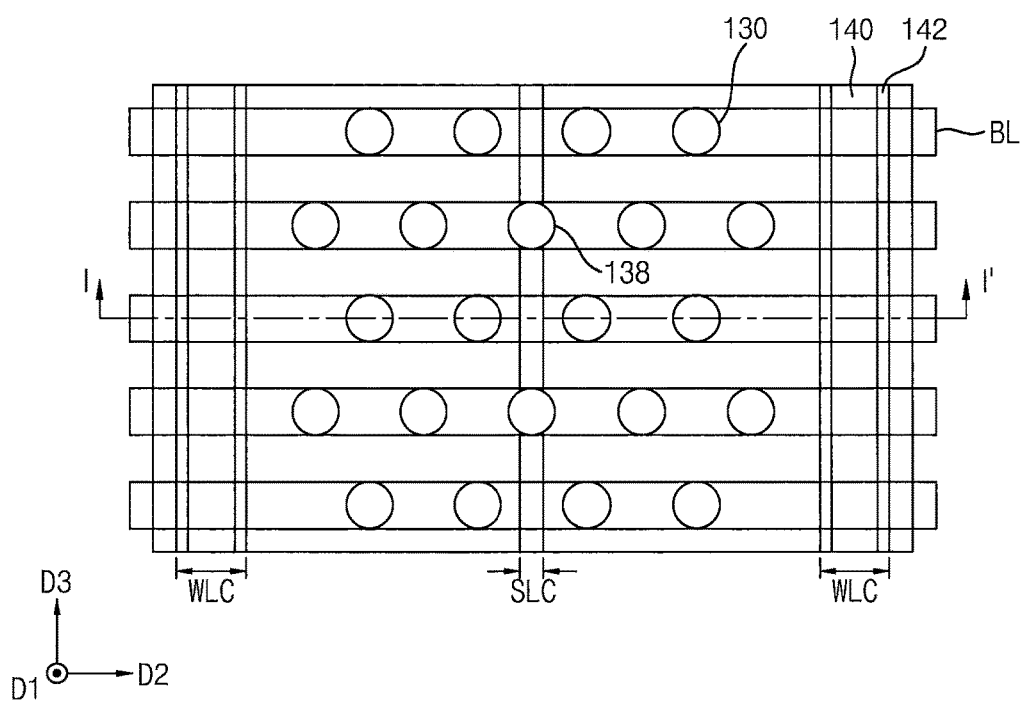
FIG. 1 is a schematic layout of some regions of a semiconductor device according to an embodiment of the present inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components and/or regions, these elements, components and/or regions should not be limited by these terms. These terms are only used to distinguish one element, component and/or region from another element, component and/or region. Thus, a first element, component and/or region discussed below could be termed a second element, component and/or region without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Figure 2:
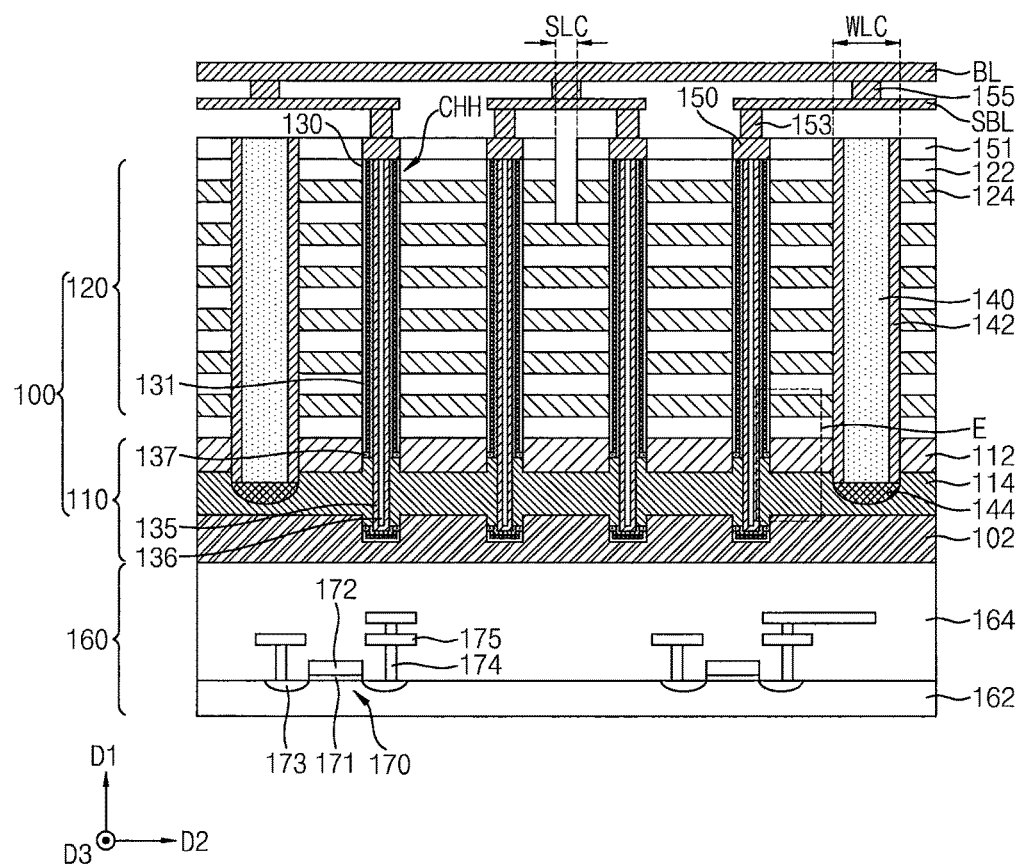
FIG. 2 is a vertical sectional view taken along line I-I' of FIG. 1.

FIG. 1 is a schematic layout view of a semiconductor memory device according to an embodiment of the present inventive concept, and FIG. 2 is a cross-sectional view of the semiconductor device of FIG. 1 taken along line I-I' of FIG. 1. A memory device according to embodiments of the present inventive concept may include flash memory such as a VNAND (vertical NAND) or a 3D-NAND.

Referring to FIGS. 1 and 2, the memory device according to the embodiment of the present inventive concept may include a cell region 100 and a peripheral region 160. The memory device may have a cell-on-peripheral (COP) structure in which a cell region 100 is formed on a peripheral region 160, as illustrated by FIG. 2. The cell region 100 may include a lower stacked structure 110 including a substrate 102, an upper stacked structure 120, bit lines BL, and word line cuts WLC.

Hereinafter, a first direction D1 may refer to a direction in which the cell region 100 and the peripheral region 160 are stacked. For example, the first direction D1 may refer to a direction perpendicular to a main surface of the substrate 102. A second direction D2 may refer to a direction which is perpendicular to the first direction D1 and parallel to the bit lines BL. A third direction D3 may refer to a direction which is perpendicular to the first direction D1 and the second direction D2 and parallel to the word line cuts WLC.

The lower stacked structure 110 may include the substrate 102, a first source film 112, and a second source film 114. The first source film 112 and the second source film 114 may be formed on the substrate 102. The second source film 114 may be formed below the first source film 112, and at least a portion of the second source film 114 may be in contact with a side surface of the first source film 112. The substrate 102 may be polysilicon containing a P-type impurity, and the first source film 112 and the second source film 114 may be polysilicon containing an N-type impurity.

Insulating layers 122 and gate electrodes 124 may be alternately stacked within the upper stacked structure 120, as illustrated by FIG. 2. The insulating layers 122 may electrically insulate the gate electrodes 124. Some of the gate electrodes 124 formed at a lower portion of the upper stacked structure 120 may be configured as ground selection lines GSL. Some of the gate electrodes 124 formed at an upper portion of the upper stacked structure 120 may be string selection lines SSL or drain selection lines DSL. In some embodiments of the invention, an insulating film which surrounds each gate electrode 124 may be formed between the insulating layers 122.

The memory device may include channel holes CHH, which pass through the upper stacked structure 120 and the first source film 112 and extend downward in the first direction D1. Four or five channel holes CHH, for example, may be formed between the common source lines 140 in the second direction D2. A channel structure 130 may be formed inside each channel hole CHH. The channel structure 130 may include an information storage pattern 131, a channel pattern 135, and a core pattern 136 which are sequentially formed from the outside of the channel hole CHH toward the inside thereof.

The word line cut WLC disposed adjacent to the channel structure 130 may be formed in the memory device. The word line cut WLC may pass through the upper stacked structure 120 and the first source film 112 in the first direction D1 and extend in the third direction D3. The common source line 140, a sidewall insulating film 142, and an impurity region 144 may be formed along the word line cut WLC. The sidewall insulating film 142 may be formed on a side surface of the word line cut WLC, and the impurity region 144 may be formed on a lower portion of the word line cut WLC.

A string selection line cut SLC may be formed between the common source lines 140. The string selection line cut SLC may be formed above a dummy channel structure 138 in the third direction D3. The string selection line cut SLC may divide at least one of the plurality of gate electrodes 124. For example, the string selection line cut SLC may divide the string selection line SSL. The dummy channel structure 138 may not be electrically connected to the bit line BL.

Conductive pads 150 may be formed on the upper stacked structure 120, and may be located at the same level as an interlayer dielectric 151. The conductive pad 150 may be formed on the channel structure 130 in each channel hole CHH. The conductive pad 150 may be in contact with the channel pattern 135. The conductive pad 150 may be connected to a sub bit line SBL through a first bit plug 153, and the sub bit line SBL may be connected to the bit line BL through a second bit plug 155. Although not shown, insulating layers located at the same level may be formed on the first bit plug 153, the second bit plug 155, and the sub bit line SBL. Here, the "level" may refer to a height from the substrate 102 in the first direction D1.

The peripheral region 160 may be formed below the cell region 100. The peripheral region 160 may include a lower substrate 162 and a lower insulating layer 164 formed on the lower substrate 162. Peripheral transistors 170 may be formed in the peripheral region 160. The peripheral transistor 170 may include a peripheral gate insulating film 171, a peripheral gate electrode 172, and a source/drain region 173. The peripheral transistor 170 may be connected to an interconnection pattern 175 through a contact plug 174, and the peripheral transistor 170 and the interconnection pattern 175 may constitute a peripheral circuit. The lower insulating layer 164 may be formed to cover the peripheral transistor 170 and the interconnection pattern 175.

Figure 3:
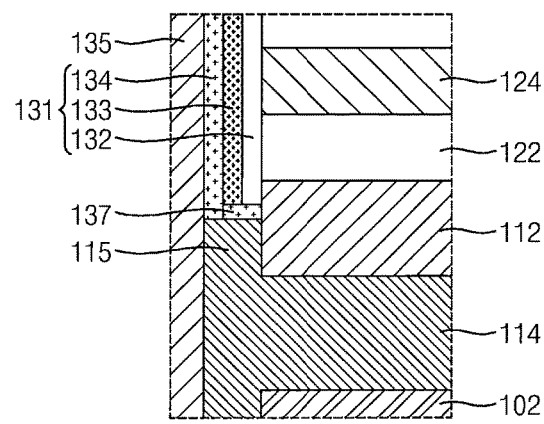
FIG. 3 is an enlarged view of a region E shown in FIG. 2.

FIG. 3 is an enlarged view of region E shown in FIG. 2. Referring to FIG. 3, the second source film 114 may be formed between the first source film 112 and the substrate 102. The second source film 114 may be in contact with the channel pattern 135. In an embodiment of the invention, the second source film 114 may include a protrusion 115 which extends upward in the first direction D1.

The information storage pattern 131 may be formed outside the channel pattern 135. The information storage pattern 131 may include a blocking layer 132, a charge storage layer 133, and a tunnel insulation layer 134, which are sequentially formed from the outside of the channel hole CHH toward the inside thereof. The information storage pattern 131 may be partially disconnected in the first direction D1. Lower ends of the blocking layer 132, the charge storage layer 133, and the tunnel insulation layer 134 may be located at a lower level than a lower end of the gate electrode 124.

A channel protective film 137 may be formed between a portion of the protrusion 115 of the second source film 114 and the information storage pattern 131. For example, the channel protective film 137 may be formed below the blocking layer 132 and the charge storage layer 133. The channel protective film 137 may include an insulating material identical to the tunnel insulation layer 134. For example, the channel protective film 137 may include silicon oxynitride. In an embodiment of the invention, the channel protective film 137 may include an insulating material having an etch selectivity with respect to the tunnel insulation layer 134. The channel protective film 137 may fill a space, which is generated between the charge storage layer 133 and the insulating layer 122 as a result of the blocking layer 132 being over-etched. The channel protective film 137 may be formed at a lower end of the information storage pattern 131 and may cause the etching of the information storage pattern 131 to be uniform. The channel protective film 137 may be formed as two or more layers in some embodiments of the invention.

A lower end of the channel protective film 137 may be located at the same level as an upper end of the first source film 112, or may be located at a lower level than the upper end of the first source film 112. Also, the tunnel insulation layer 134 may be located at the same level as the upper end of the first source film 112, or may be located at a lower level than the upper end of the first source film 112. For example, the lower end of the channel protective film 137 may be located at a low position at which a distance from the upper end of the first source film 112 is 150 Å or less. When the lower end of the channel protective film 137 is located at a higher level than the upper end of the first source film 112, particularly at a higher level than an upper end of the insulating layer 122, a problem may occur with the on/off control of the gate electrode 124 due to the influence with the second source film 114. Alternatively, when the lower end of the channel protective film 137 is located at a lower level at which a distance from the upper end of the first source film 112 is 150 Å or more, a contact area between the channel pattern 135 and the second source film 114 may be reduced and thus channel resistance therebetween may be increased. Furthermore, it may be difficult to form holes during a memory erase operation.

Figure 4:
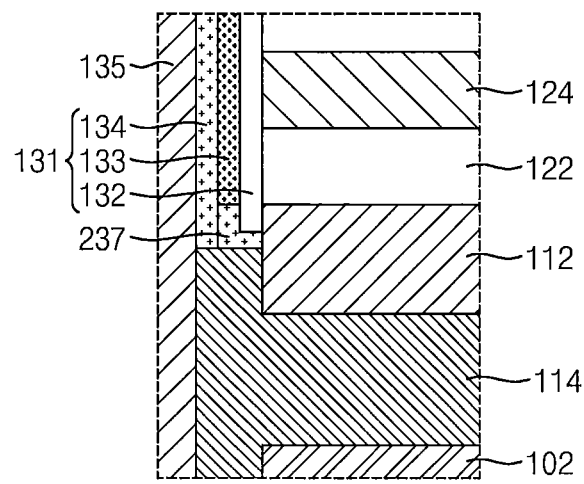
FIGS. 4 to 8 are enlarged views of a region E according to other embodiments of the inventive concept, which correspond to the region E of FIG. 3.

FIGS. 4 to 8 are highlighted (i.e., enlarged) views of a region E according to other embodiments of the invention and correspond to the region E of FIG. 3. Referring to FIG. 4, a channel protective film 237 may be formed below the blocking layer 132 and the charge storage layer 133. The channel protective film 237 may be formed to protrude upward from a lower portion of the charge storage layer 133 in the first direction D1. A lower end of the charge storage layer 133 may be located at a higher level than lower ends of the blocking layer 132 and the tunnel insulation layer 134. As shown in FIG. 4, even when the partially etched lower end of the information storage pattern 131 is not uniform, the channel protective film 237 is formed at the lower end of the information storage pattern 131 so that it is possible to control the etching of the information storage pattern 131 to be uniform.

Figure 5:
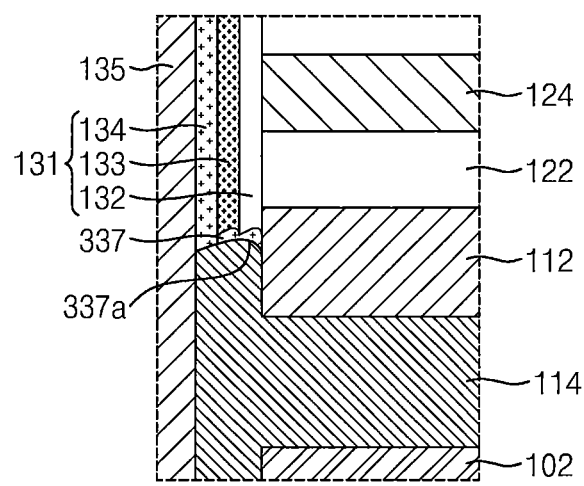

Referring to FIG. 5, a lower end of a channel protective film 337 may include a convex portion 337a which is convex upward. An upper end of the convex portion 337a may be located at the same level as the upper end of the first source film 112, or may be located at a lower level than the upper end of the first source film 112. The upper and lower ends of the convex portion 337a may be located at a low position at which a distance from the upper end of the first source film 112 is 150 Å or less.

Figure 6:
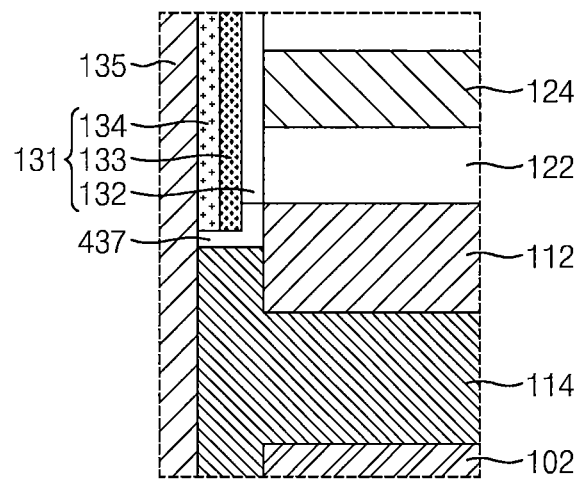

Referring to FIG. 6, a channel protective film 437 may be formed below the blocking layer 132, the charge storage layer 133, and the tunnel insulation layer 134. The channel protective film 437 may be formed to protrude upward from a lower portion of the blocking layer 132 in the first direction D1. The lower end of the blocking layer 132 may be located at a higher level than the lower ends of the charge storage layer 133 and the tunnel insulation layer 134. A lower end of the channel protective film 437 may be located at the same level as the upper end of the first source film 112, or may be located at a lower level than the upper end of the first source film 112. The channel protective film 437 may include silicon oxide.

Figure 7:
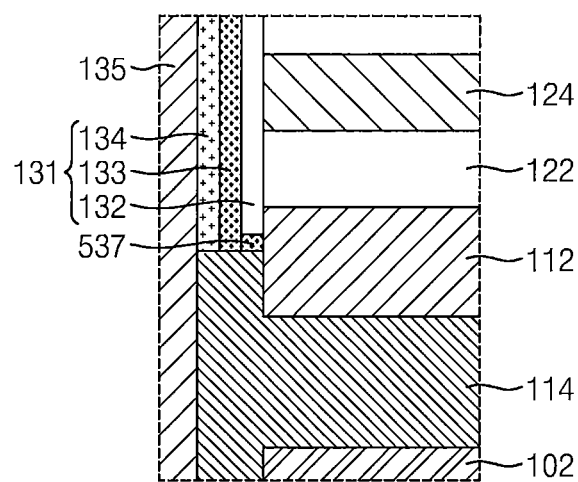

Referring to FIG. 7, a channel protective film 537 may be formed below the blocking layer 132. The lower end of the blocking layer 132 may be located at a higher level than the lower ends of the charge storage layer 133 and the tunnel insulation layer 134. The channel protective film 537 may include silicon nitride (e.g., Si3N4).

Figure 8:
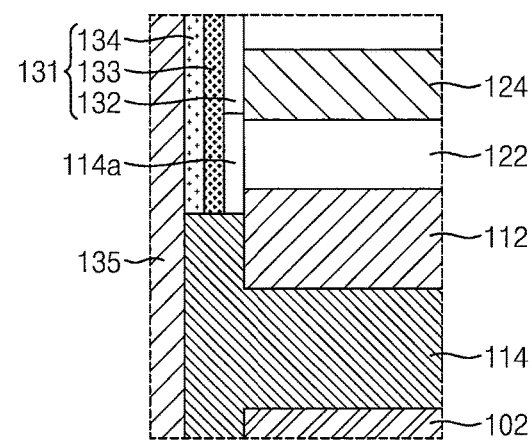

Referring to FIG. 8, a channel oxide film 114a is shown as another embodiment of the channel protective film 137. The channel oxide film 114a may be formed below the blocking layer 132. An upper end of the channel oxide film 114a may be located at a higher level than the upper end of the first source film 112. For example, the upper end of the channel oxide film 114a may be located at the same level as the upper end of the insulating layer 122, or may be located at a higher level than the upper end of the insulating layer 122. The channel oxide film 114a may include silicon oxide. The channel oxide film 114a may be formed without a process of depositing the channel protective film 137. For example, the channel oxide film 114a may be formed using a wet oxidation process after the second source film 114 is formed. A lower end of the channel oxide film 114a may be located at the same level as the upper end of the first source film 112, or may be located at a lower level than the upper end of the first source film 112.

FIGS. 9 to 15, 16A, 16B, and 17 to 23 are cross-sectional views, which are taken along line I-I' of FIG. 1 and shown in accordance with a process sequence for describing a method of manufacturing a cell region 100 according to an embodiment of the present inventive concept. FIG. 16B is an enlarged view of a region E shown in FIG. 16A.

Figure 9:
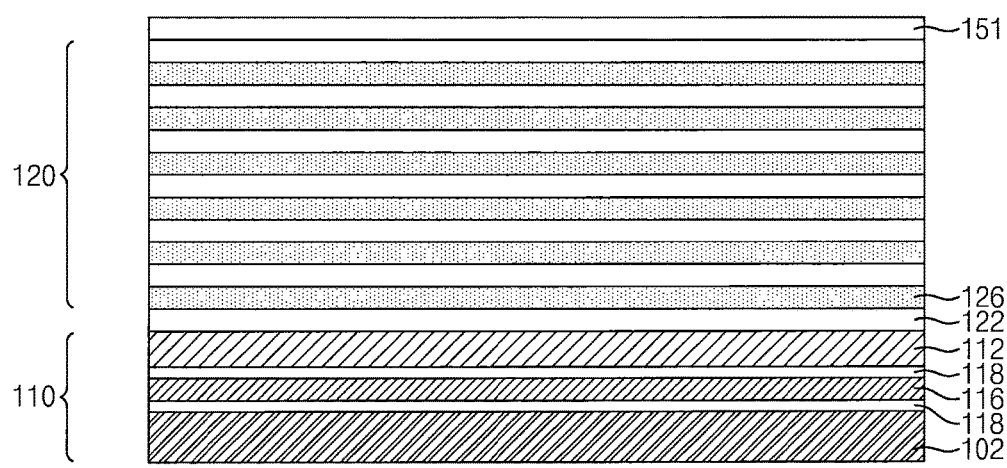
FIGS. 9 to 15, 16A, 16B, and 17 to 23 are cross-sectional views shown in accordance with a process sequence for describing a method of manufacturing a cell region according to an embodiment of the present inventive concept.

Referring to FIG. 9, an upper stacked structure 120 may be formed on a lower stacked structure 110. The lower stacked structure 110 may include a substrate 102. A first source film 112, a sacrificial film 116, and source insulating films 118 may be formed on the substrate 102. The substrate 102 may include a silicon wafer, a silicon-on-insulator (SOI) substrate, a silicon monocrystalline film formed on an insulating film, or polysilicon region formed on an insulating film, for example. The substrate 102 may include a P-type impurity such as boron (B). In an embodiment, the substrate 102 may be disposed on a peripheral region 160. For example, the substrate 102 may be formed by depositing a polysilicon film doped with a P-type impurity on the peripheral region 160, or may be formed by depositing a polysilicon film/layer on the peripheral region 160 and then doping it with a P-type impurity.

The first source film 112 may be formed on the sacrificial film 116, and the source insulating films 118 may be formed above and below the sacrificial film 116. The first source film 112 may include polysilicon and may include an N-type impurity. The sacrificial film 116 and the source insulating films 118 may include an insulating material such as silicon oxide, silicon nitride, silicon oxynitride, or a combination thereof. In an embodiment, the sacrificial film 116 may include silicon nitride and the source insulating films 118 may include silicon oxide.

The upper stacked structure 120 may be formed on the first source film 112. The upper stacked structure 120 may be formed by insulating layers 122 and sacrificial layers 126 being alternately stacked, as shown. The insulating layer 122 may include an insulating material such as silicon oxide, silicon nitride, or silicon oxynitride, for example. The sacrificial layer 126 may include an insulating material having an etch selectivity with respect to the insulating layer 122. For example, the insulating layer 122 may include silicon oxide and the sacrificial layer 126 may include silicon nitride. An interlayer dielectric 151 may be formed on the upper stacked structure 120. The interlayer dielectric 151 may include an insulating material such as silicon oxide, silicon nitride, or silicon oxynitride.

Figure 10:
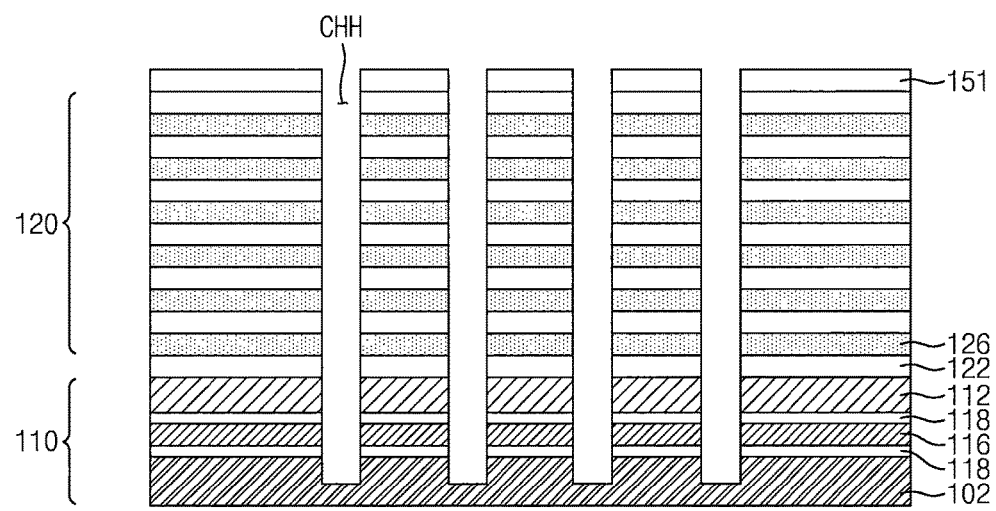

Referring to FIGS. 1 and 10, channel holes CHH may be formed to pass through the upper stacked structure 120, the first source film 112, the sacrificial film 116, and the source insulating films 118. The channel holes CHH may have a cylindrical shape which extends downward in the first direction D1. In an embodiment, the channel holes CHH may have a conical shape or a truncated conical shape of which a diameter decreases toward the substrate 102. The channel holes CHH may be formed using an anisotropic etching process, such as a deep reactive-ion etching (DRIE) process.

Figure 11:
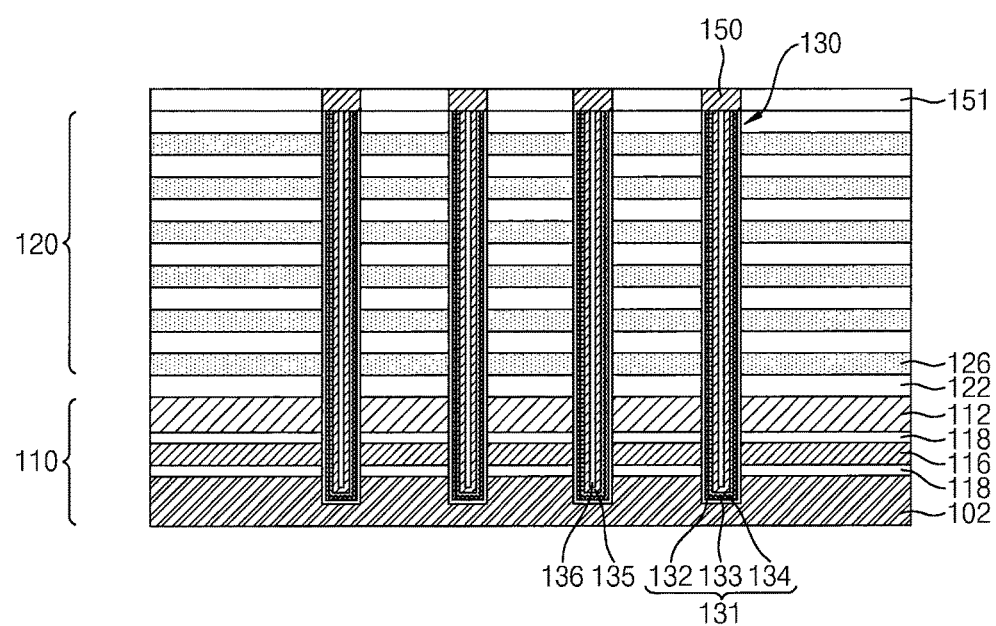

Referring to FIG. 11, a channel structure 130 and a conductive pad 150 may be formed in the channel hole CHH. The channel structure 130 may include an information storage pattern 131, a channel pattern 135, and a core pattern 136 which are sequentially formed from the outside of the channel hole CHH toward the inside thereof. The information storage pattern 131 may include a blocking layer 132, a charge storage layer 133, and a tunnel insulation layer 134 which are sequentially formed from the outside of the channel hole CHH toward the inside thereof.

The channel structure 130 may be formed by filling a space, which remains after the information storage pattern 131 and the channel pattern 135 are sequentially formed in the channel hole CHH, with the core pattern 136. The information storage pattern 131 and the channel pattern 135 may be formed using a chemical vapor deposition (CVD) method, a physical vapor deposition (PVD) method, an atomic layer deposition (ALD) method, or a similar method.

The blocking layer 132, the charge storage layer 133, and the tunnel insulation layer 134 may include an electrically insulating material. For example, the blocking layer 132 may include silicon oxide and the charge storage layer 133 may include silicon nitride. The tunnel insulation layer 134 may include silicon oxynitride.

The channel pattern 135 may include polysilicon, and the core pattern 136 may include an electrically insulating material such as silicon oxide, silicon nitride, silicon oxynitride, or a high-K material, for example. The conductive pad 150 may be formed on the channel structure 130. After a thin film is formed on the interlayer dielectric 151 and the channel structure 130, the conductive pad 150 may be formed using a planarization process, such as a chemical mechanical polishing (CMP) process and/or an etch-back process. The conductive pad 150 may include a conductive material such as polysilicon, a metal, a metal silicide, or a combination thereof. A dummy channel structure 138 may be formed with the same method as the channel structure 130.

Figure 12:
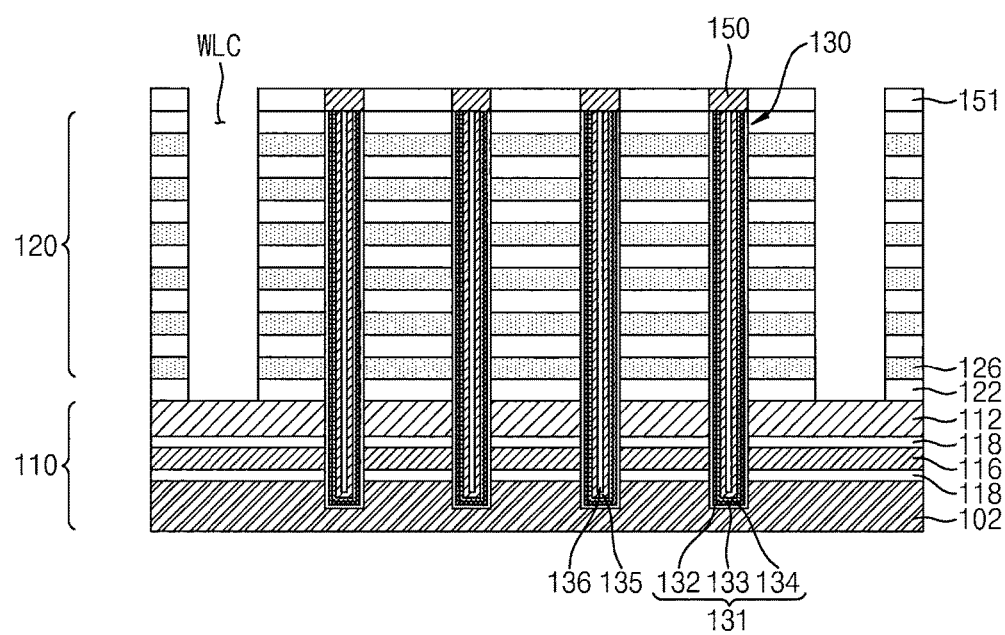

Referring to FIGS. 1 and 12, the word line cuts WLC may be formed by etching the upper stacked structure 120. The word line cuts WLC may extend in the third direction D3. The word line cuts WLC may be formed using an anisotropic etching, method. For example, the upper stacked structure 120 may be etched using an RIE (e.g., deep reactive ion etching (DRIE)) process. In the etching of the upper stacked structure 120, the first source film 112 may be used as an etch stop film.

Figure 13:
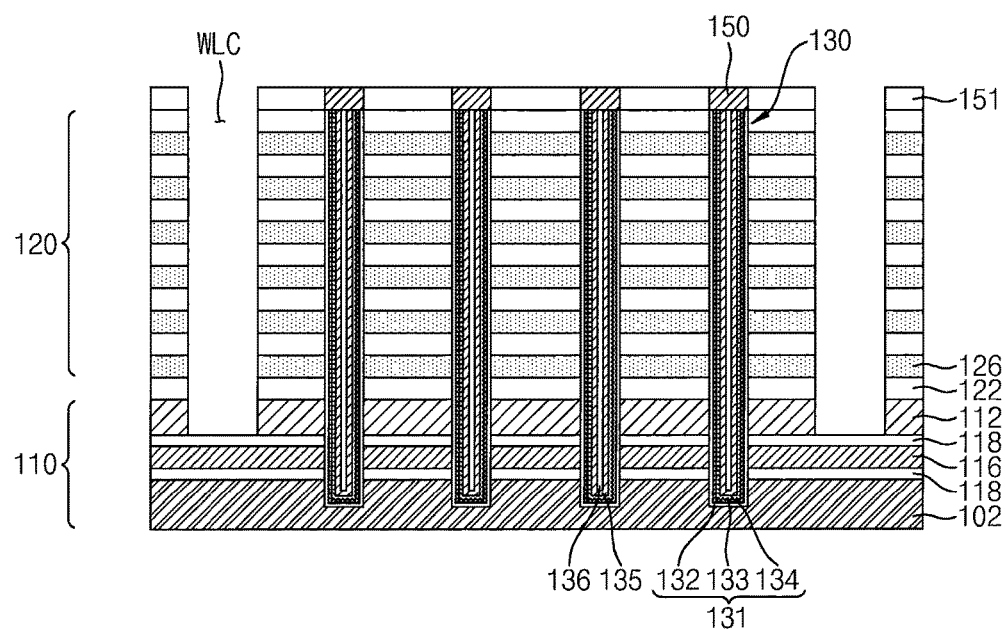
Figure 14:
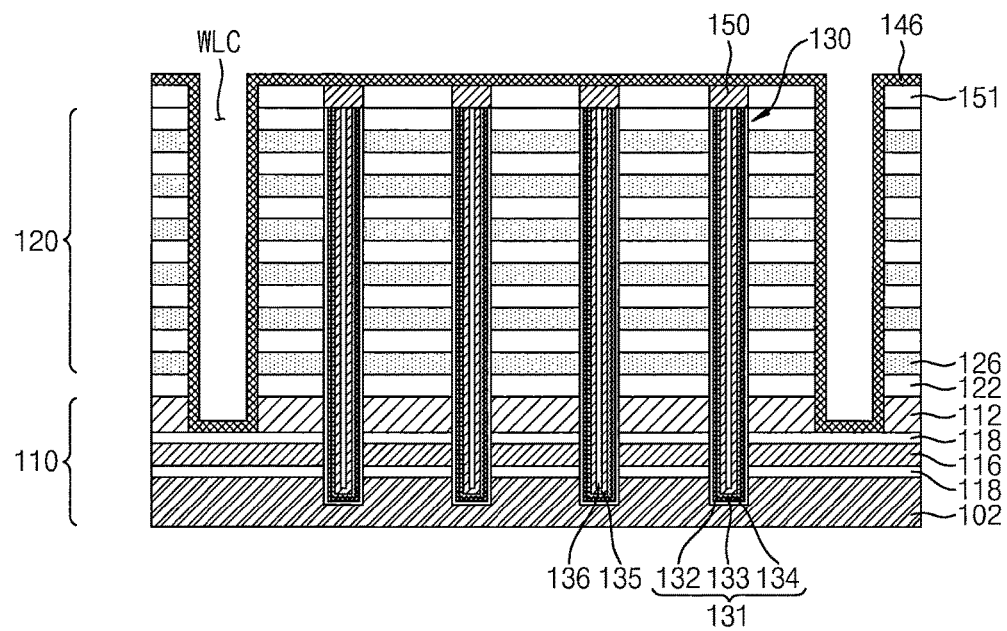

Referring to FIGS. 13-14, the first source film 112 may be removed along the word line cuts WLC. In the removal of the first source film 112, the source insulating film 118 may be used as an etch stop film. Then, a poly spacer 146 may be formed on side surfaces of the insulating layers 122 and the sacrificial layers 126 of the upper stacked structure 120, which are exposed by the word line cuts WLC, and on the source insulating films 118, as shown by FIG. 14. Further, the poly spacer 146 may be formed on the interlayer dielectric 151. The poly spacer 146 may protect the insulating layer 122 and the sacrificial layer 126 from being damaged in a process of forming a second source film 114 to be described below.

Figure 15:
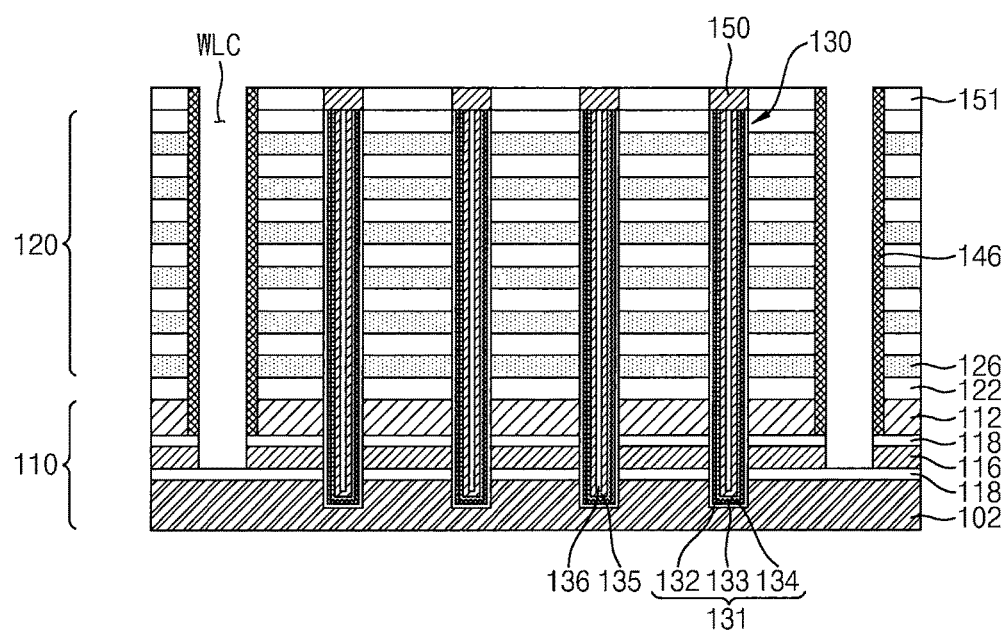

Referring to FIG. 15, the poly spacer 146 formed on the source insulating film 118 along the word line cuts WLC may be removed. The poly spacer 146 may be removed using an anisotropic etching process. For example, the poly spacer 146 may be etched using an RIE process. Next, the sacrificial film 116 and the source insulating film 118 which is disposed on the substrate 102 may be exposed by removing the source insulating film 118 which is disposed on the sacrificial film 116. Although not shown, a photomask may be used for etching the source insulating film 118 and the sacrificial film 116.

Figure 16A:
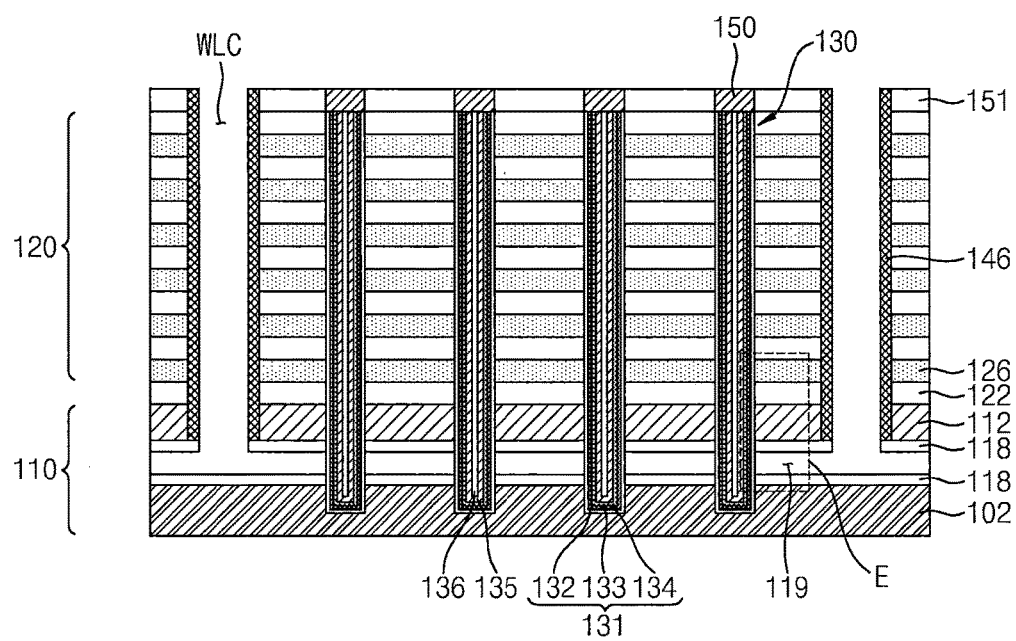
Figure 16B:
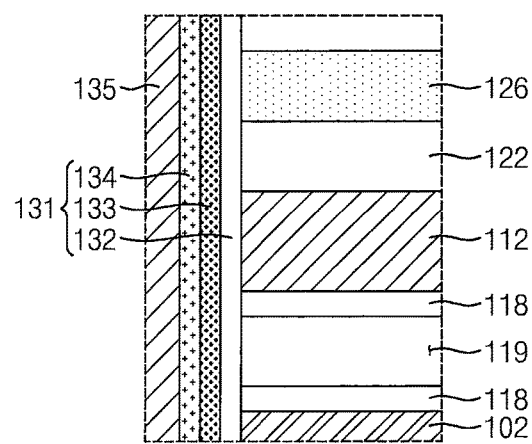

FIG. 16A is a cross-sectional view for describing the process of removing the sacrificial film 116, and FIG. 16B is an enlarged view of the region E shown in FIG. 16A. Referring to FIGS. 16A and 16B, the exposed sacrificial film 116 may be removed and an opening 119 may be formed between the source insulating films 118. Further, the sacrificial film 116 may be removed and thus the blocking layer 132 may be exposed. The sacrificial film 116 may be removed using an isotropic etching process and selectively removed. The source insulating films 118 and blocking layer 132 having an etch selectivity with respect to the sacrificial film 116 may not be damaged during the process of removing the sacrificial film 116.

Figure 17:
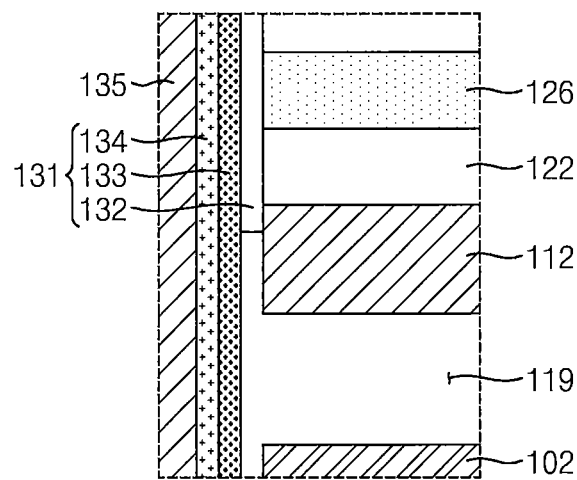

FIGS. 17 to 20 are partially enlarged views of the region E for describing a method of forming a channel opening OP and the second source film 114. Referring to FIG. 17, a portion of the blocking layer 132 and the source insulating films 118 may be removed. A lower end of the blocking layer 132 may be located at the same level as an upper end of the first source film 112, or may be located at a lower level than the upper end of the first source film 112. The blocking layer 132 may be partially removed so that the channel opening OP may be formed below the information storage pattern 131 in the first direction D1.

Figure 18:
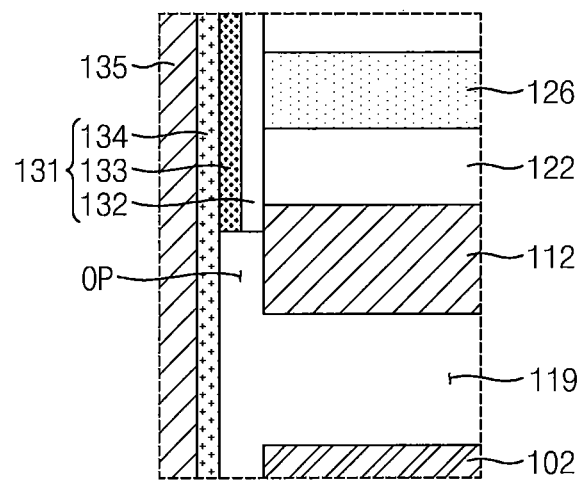

Referring to FIG. 18, a portion of the charge storage layer 133 may be removed. In the process of removing the charge storage layer 133, the blocking layer 132 and tunnel insulation layer 134 having an etch selectivity with respect to the charge storage layer 133 may not be damaged. A lower end of the charge storage layer 133 may be located at the same level as the lower end of the blocking layer 132.

Figure 19:
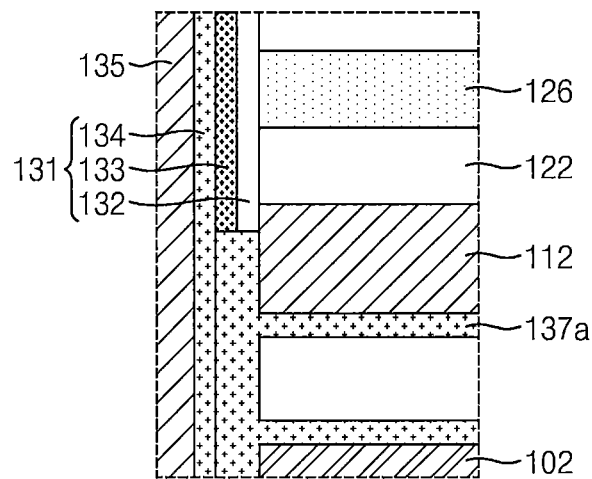

Referring to FIG. 19, a channel protective layer 137a may be formed on surfaces of the substrate 102, the first source film 112, the blocking layer 132, the charge storage layer 133, and the tunnel insulation layer 134, which are exposed by the opening 119 and the channel opening OP. In one embodiment of the inventive concept, the channel protective layer 137a may completely fill the channel opening OP. The channel protective layer 137a may include an insulating material identical to the tunnel insulation layer 134. For example, the channel protective layer 137a may include silicon oxide.

Figure 20:
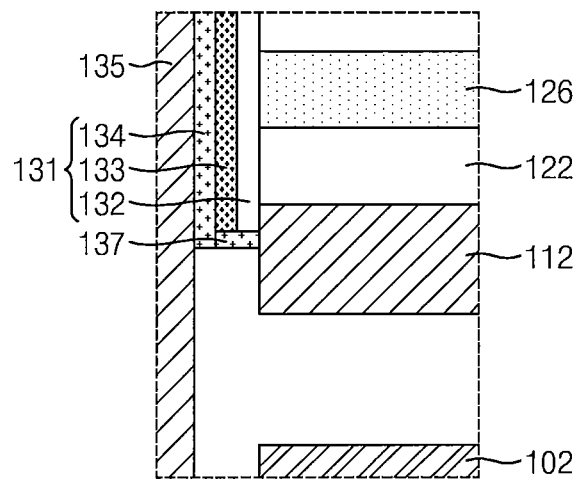

Referring to FIG. 20, the channel protective layer 137a formed in the opening 119 and a portion of the channel protective layer 137a formed in the channel opening OP may be removed, and a channel protective film 137 may be formed. The channel opening OP may be formed outside the channel pattern 135 to extend in the first direction D1. The channel opening OP may be located at the same level as the information storage pattern 131 in a second direction D2. The channel opening OP may expose the channel pattern 135, and may be filled with a portion of the second source film 114. The channel protective film 137 may be located at both ends of the channel opening OP.

Since the information storage pattern 131 may be composed of the blocking layer 132, the charge storage layer 133, and the tunnel insulation layer 134 which are different layers, it may be difficult to control a depth of an etched surface of the information storage pattern 131 to be constant when the information storage pattern 131 is etched. As shown in FIGS. 19 and 20, the channel protective layer 137a is formed in the channel opening OP, which is formed by removing portions of the blocking layer 132 and the charge storage layer 133, and then is etched again, and thus it is possible to control the information storage pattern 131 composed of a multi-layer film to be uniformly etched.

Figure 21:
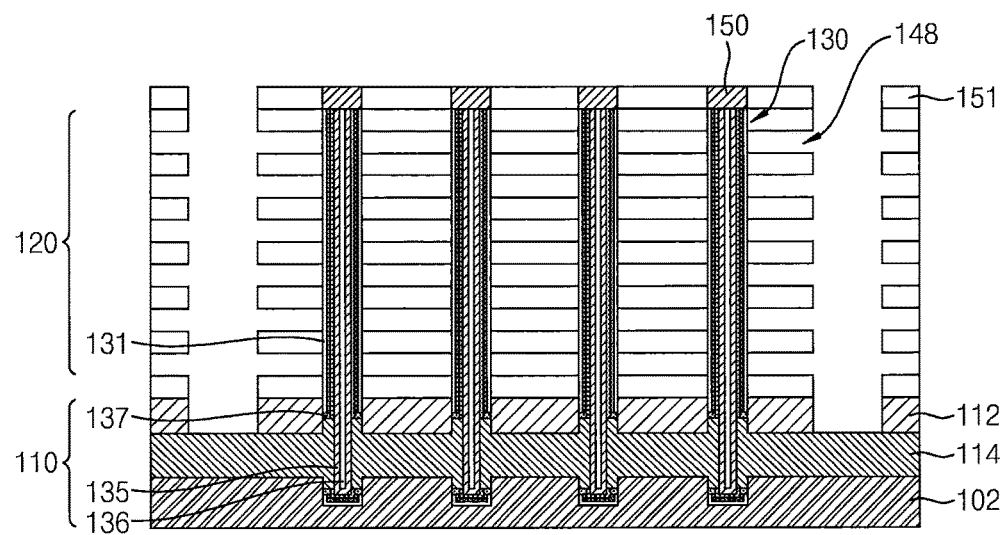

Referring now to FIG. 21, the second source film 114 may be formed in the opening 119 and the channel opening OP. The second source film 114 may be in contact with the channel pattern 135. The second source film 114 may include a protrusion 115 which protrudes upward from a lower portion of the first source film 112 in the first direction D1. The protrusion 115 may be in contact with a side surface of the first source film 112 and the channel protective film 137. After the second source film 114 is formed, the poly spacer 146 may be removed. Although not shown, a photomask may be used for removing the poly spacer 146.

After the poly spacer 146 is removed, the sacrificial layer 126 of the upper stacked structure 120 may be selectively removed. The sacrificial layer 126 may be removed using an isotropic etching process and openings 148 may be formed. The insulating layer 122, first source film 112, and second source film 114 having an etch selectivity with respect to the sacrificial layer 126 may not be damaged in the process of removing the sacrificial layer 126.

Figure 22:
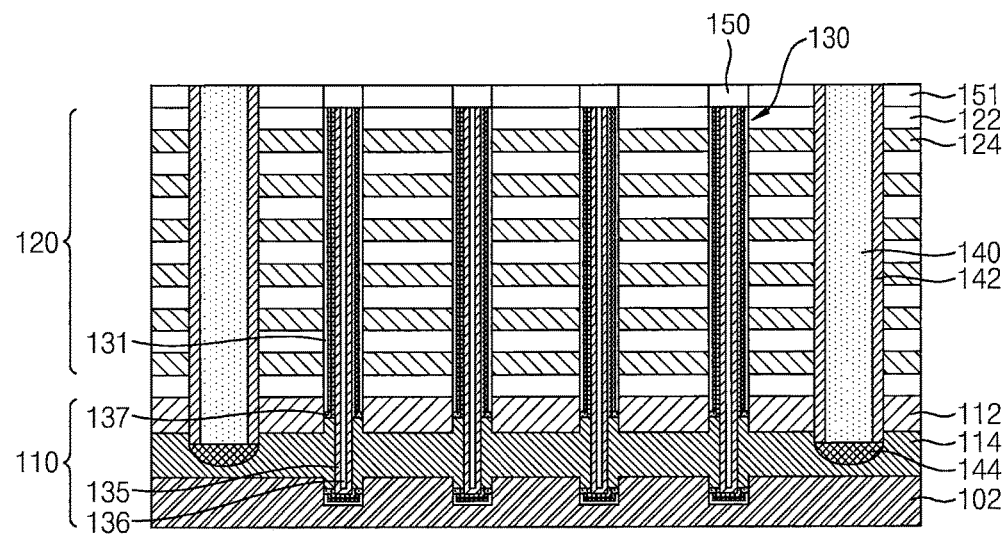

Referring to FIG. 22, a gate electrode 124 may be formed in the opening 148. The gate electrode 124 may include an electrically conductive material such as a metal, a metal oxide, a metal nitride, polysilicon, conductive carbon, or any combination thereof. For example, the conductive material may include Ti, TiN, Ta, TaN, CoSi, NiSi, WSi, or a combination thereof. Although not shown, the conductive material formed above the interlayer dielectric 151, and below the word line cuts WLC and at side portions of the word line cuts WLC may be removed using an anisotropic etching process or an isotropic etching process.

A common source line 140, a sidewall insulating film 142, and an impurity region 144 may be formed in the word line cut WLC. The sidewall insulating film 142 may be formed on side surfaces of the insulating layers 122 and the gate electrodes 124, which are exposed by the word line cut WLC after the gate electrodes 124 are formed. The sidewall insulating film 142 may electrically insulate the common source line 140 from the gate electrodes 124.

The impurity region 144 may be formed in a lower portion of the word line cut WLC. The impurity region 144 may be formed by implanting impurity ions into the lower portion of the word line cut WLC. In an embodiment, the impurity region 144 may include an N-type impurity such as phosphorous (P) or arsenic (As).

The common source line 140 may be formed along the word line cut WLC after the impurity region 144 is formed. The common source line 140 may include a conductive material such as polysilicon, a metal, a metal oxide, a metal nitride, a metal silicide, or a combination thereof. In another embodiment, the common source line 140 may include an insulating material such as silicon oxide or silicon nitride.

Figure 23:
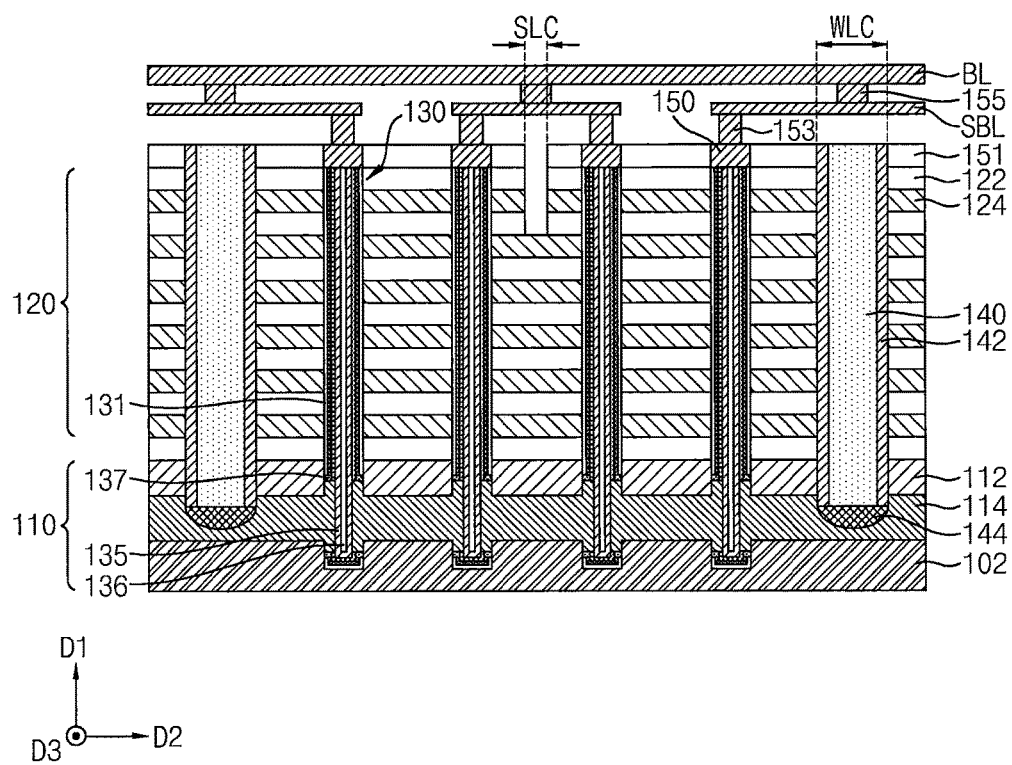

Referring to FIGS. 1 and 23, the string selection line cut SLC may be formed between the common source lines 140. The string selection line cut SLC may be formed above the dummy channel structure 138 in the third direction D3. The string selection line cut SLC may divide at least one of the plurality of gate electrodes 124. As shown by FIG. 23, first bit plugs 153, second bit plugs 155, bit lines BL, sub bit lines SBL, and the string selection line cut SLC may be formed. Although not shown, insulating layers may be formed at the same level as each of the first bit plugs 153, the second bit plugs 155, and the sub bit lines SBL. The first bit plug 153, the second bit plug 155, the bit line BL, and the sub bit line SBL may include an electrically conductive material such as a metal, a metal silicide, a metal oxide, a metal nitride, polysilicon, conductive carbon, or a combination thereof.

Figure 24:
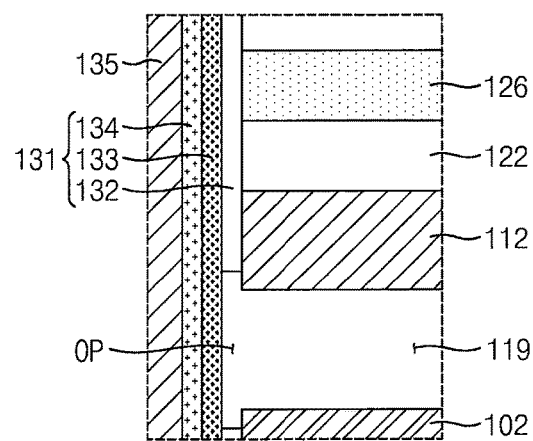
FIGS. 24 to 28 are enlarged views of a region E shown in accordance with a process sequence for describing a process of forming a channel protective film shown in FIG. 6.
Figure 25:
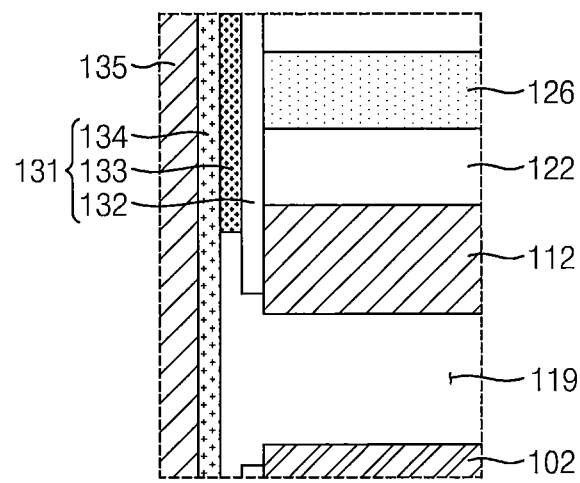

FIGS. 24 to 28 are enlarged views of the region E shown in accordance with a process sequence for describing the process of forming the channel protective film 437 shown in FIG. 6. Referring to FIGS. 16B and 24, the source insulating films 118 formed in the opening 119 may be removed. The blocking layer 132 may be partially removed to form the channel opening OP. As shown by FIG. 25, the charge storage layer 133 may be selectively removed. In the process of removing the charge storage layer 133, the blocking layer 132 and the tunnel insulation layer 134 having an etch selectivity with respect to the charge storage layer 133 may not be damaged.

Figure 26:
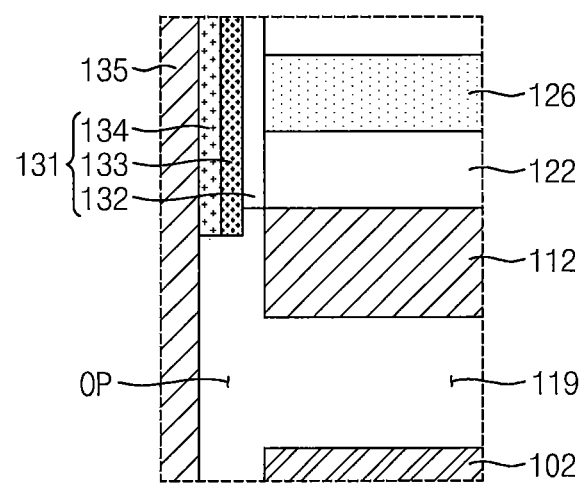

Referring to FIG. 26, the blocking layer 132 and the tunnel insulation layer 134 may be partially removed. The charge storage layer 133 having an etch selectivity with respect to the blocking layer 132 and the tunnel insulation layer 134 may not be damaged. The blocking layer 132 may be partially removed so that the lower end of the blocking layer 132 may be located at the same level as the upper end of the first source film 112 or may be located at a higher level than the upper end of the first source film 112. In an embodiment, the side surface of the insulating layer 122 or the sacrificial layer 126 may be exposed by the removed portion of the blocking layer 132.

Figure 27:
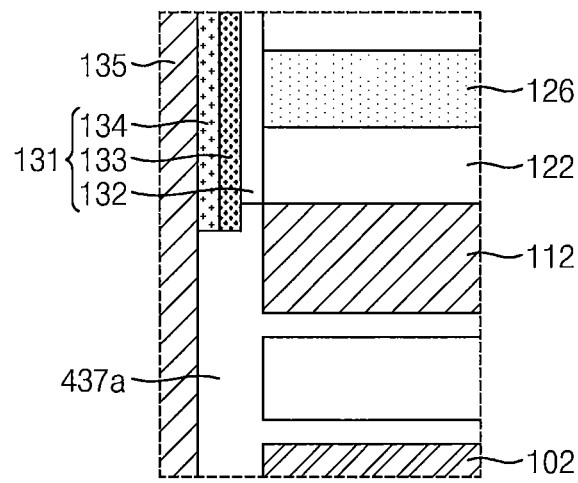

Referring to FIG. 27, a channel protective layer 437a may be formed on surfaces of the substrate 102, the first source film 112, the blocking layer 132, the charge storage layer 133, and the tunnel insulation layer 134, which are exposed by the opening 119 and the channel opening OP. The channel protective layer 437a may fill a space between the charge storage layer 133 and the insulating layer 122 or a space between the charge storage layer 133 and the sacrificial layer 126. Using a process of depositing the channel protective layer 437a, the insulating layer 122 and the sacrificial layer 126 may be prevented from being exposed. In one embodiment of the inventive concept, the channel protective layer 437a may include silicon oxide.

Figure 28:
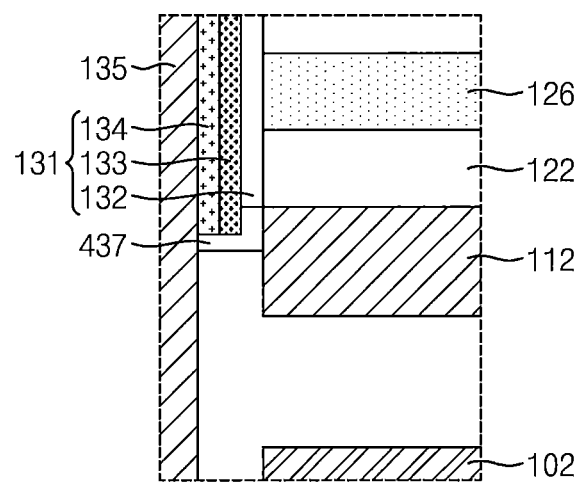

Referring to FIG. 28, the channel protective layer 437a formed in the opening 119 and a portion of the channel protective layer 437a formed in the channel opening OP may be removed and the channel protective film 437 may be formed. A lower end of the channel protective film 437 may be located at the same level as the upper end of the first source film 112, or may be located at a lower level than the upper end of the first source film 112.

Referring to FIGS. 6 and 28, the second source film 114 may be formed between the first source film 112 and the substrate 102. In a subsequent process, the sacrificial layer 126 may be removed and the gate electrode 124 may be formed.

As shown in FIGS. 24 to 28, the channel protective film 437 is formed, and thus even when the blocking layer 132 is excessively etched in comparison to the charge storage layer 133 and the tunnel insulation layer 134, it is possible to control the etching of the information storage pattern 131 to be uniform.

Figure 29:
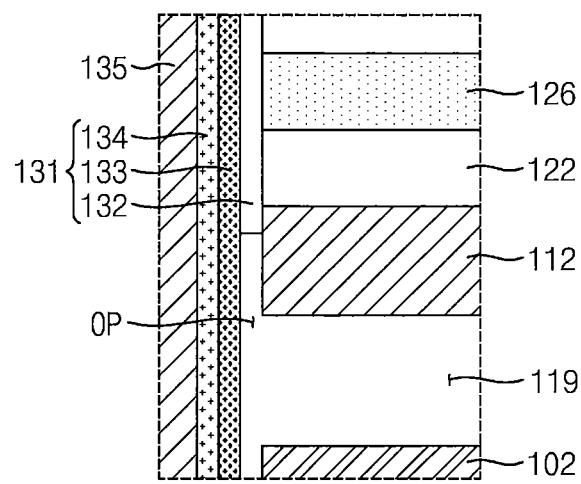
FIGS. 29 to 32 are enlarged views of a region E shown in accordance with a process sequence for describing a process of forming a channel protective film shown in FIG. 7.
Figure 30:
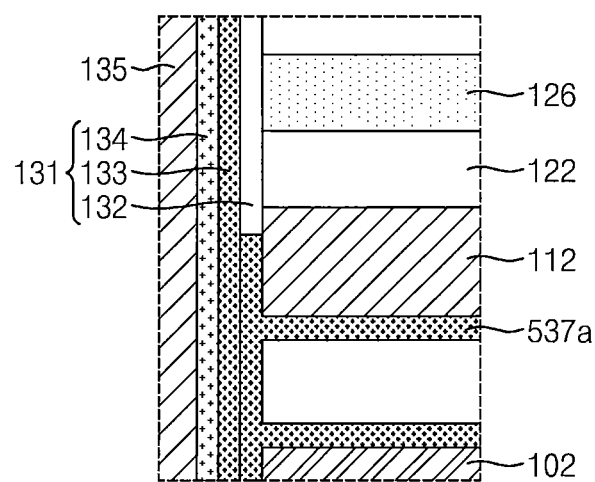

FIGS. 29 to 32 are enlarged views of the region E shown in accordance with a process sequence for describing the process of forming the channel protective film 537 shown in FIG. 7. Referring to FIGS. 16B and 29, the source insulating films 118 formed in the opening 119 may be removed. The blocking layer 132 may be partially removed and the channel opening OP may be formed. Referring to FIG. 30, a channel protective layer 537a may be formed on surfaces of the substrate 102, the first source film 112, the blocking layer 132, and the charge storage layer 133, which are exposed by the opening 119 and the channel opening OP. The channel protective layer 537a may include an insulating material having an etch selectivity with respect to the tunnel insulation layer 134. For example, the channel protective layer 537a may include silicon nitride.

Figure 31:
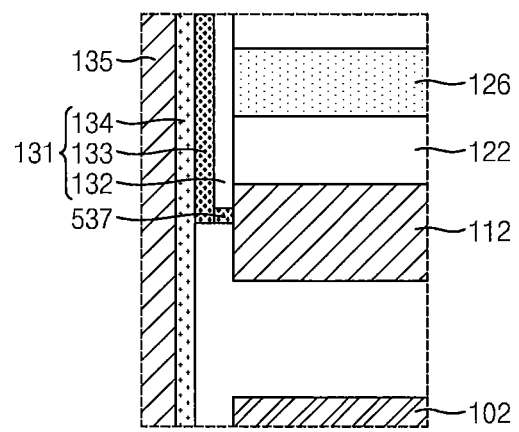
Figure 32:
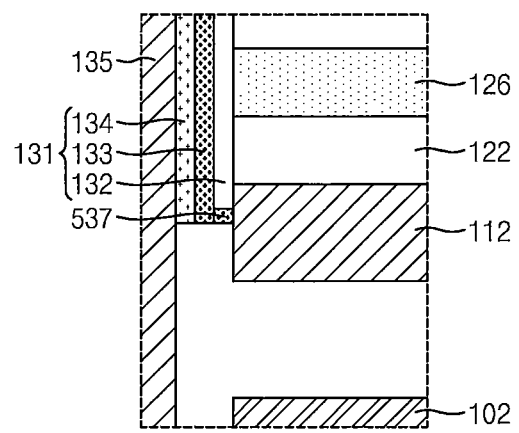

Referring to FIG. 31, portions of the charge storage layer 133 and the channel protective layer 537a may be removed. The channel protective layer 537a may be etched and the channel protective film 537 may be formed. The tunnel insulation layer 134 having an etch selectivity with respect to the charge storage layer 133 and the channel protective film 537 may not be damaged. After the etching process, the channel protective film 537 located at a lower end of the blocking layer 132 may remain without being completely removed. Referring to FIG. 32, a portion of the tunnel insulation layer 134 may be removed. The charge storage layer 133 and the channel protective film 537 having an etch selectivity with respect to the tunnel insulation layer 134 may not be damaged. Referring to FIGS. 7 and 32, the second source film 114 may be formed between the first source film 112 and the substrate 102. In a subsequent process, the sacrificial layer 126 may be removed and the gate electrode 124 may be formed.

As shown in FIGS. 29 to 32, the channel protective film 537 having an etch selectivity with respect to the tunnel insulation layer 134 may be formed, and thus damage on the blocking layer 132 may be prevented during the process of etching the tunnel insulation layer 134. Since the blocking layer 132 is not removed, the gate electrode 124 may not be exposed during the etching process. The malfunction of the gate electrode 124 may be prevented due to the above-described processes.

Figure 33:
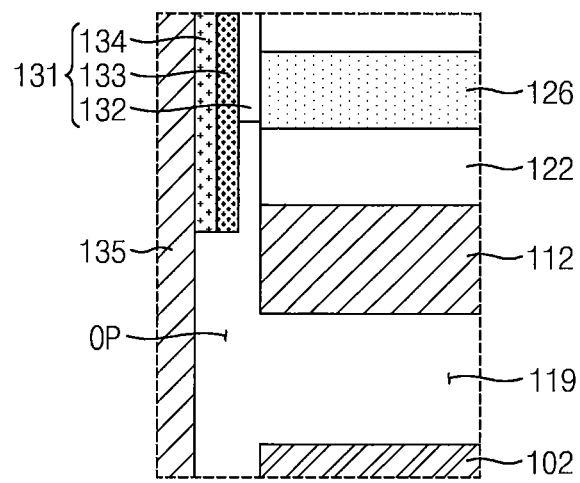
FIGS. 33 to 35 are enlarged views of a region E shown in accordance with a process sequence for describing a process of forming a channel oxide film shown in FIG. 8.
Figure 34:
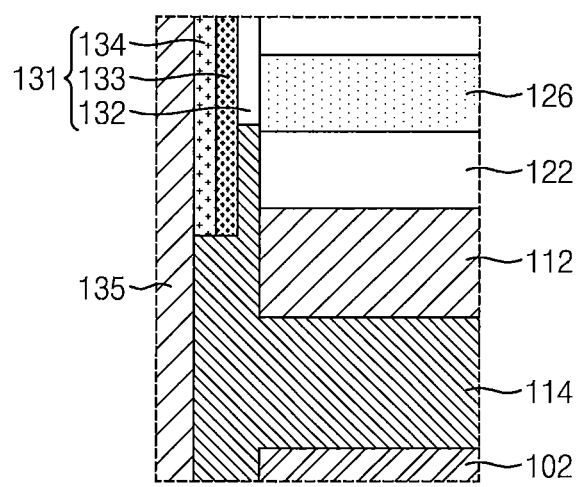
Figure 35:
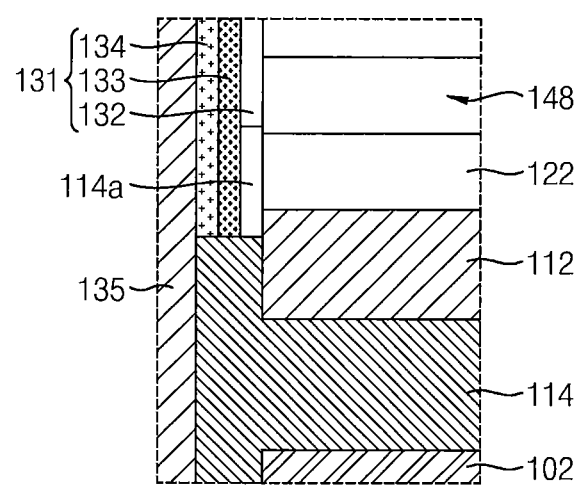

FIGS. 33 to 35 are enlarged views of the region E shown in accordance with a process sequence for describing the process of forming the channel oxide film 114a shown in FIG. 8. The information storage pattern 131 shown in FIG. 33 may be formed by performing the same processes as those in FIGS. 24 and 25. As shown in FIGS. 24 and 25, the tunnel insulation layer 134 may be exposed by sequentially removing portions of the blocking layer 132 and the charge storage layer 133.

Referring to FIG. 33, the blocking layer 132 may be excessively etched during the process of etching the blocking layer 132 and the tunnel insulation layer 134, and thus the side surface of the insulating layer 122 or the sacrificial layer 126 may be exposed. Referring to FIG. 34, the second source film 114 may be formed between the first source film 112 and the substrate 102. The second source film 114 may fill the opening OP so that the side surface of the insulating layer 122 or the sacrificial layer 126 is not exposed As shown in FIG. 21, after the second source film 114 is formed, the poly spacer 146 and the sacrificial layer 126 may be removed and the opening 148 may be formed.

Referring to FIG. 8, a portion of the second source film 114 may be oxidized by the opening 148 and the channel oxide film 114a may be formed. For example, the channel oxide film 114a may be formed by wet oxidation. By the processes shown in FIGS. 33 to 35, it is possible to control the etching of the information storage pattern 131 to be uniform without depositing the channel protective film 137. Further, by oxidizing the second source film 114 adjacent to the gate electrode 124 with the channel oxide film 114a, malfunction of the gate electrode 124 may be prevented.

According to at least some embodiments of the present inventive concept, a channel protective film can be formed during a process of etching a side surface of a channel structure, and thus it is possible to control the etching of an information storage pattern having different triple films to be uniform. According to at least some embodiments of the present inventive concept, a contact area between a channel pattern and a second source film is increased, and thus channel resistance therebetween can be reduced and a stable cell driving current can be ensured.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A memory device comprising:
a substrate having a first source film thereon;
an upper stacked structure on the first source film;
an electrically conductive channel structure extending through the upper stacked structure and the first source film, said channel structure comprising a channel pattern, which extends vertically through the upper stacked structure and the first source film, and an information storage pattern on a sidewall of the channel pattern;
a second source film extending between the first source film and a surface of said substrate, said second source film contacting the channel pattern and comprising an upward extending protrusion, which extends underneath the information storage pattern; and
a channel protective film extending between at least a portion of the protrusion and at least a portion of the information storage pattern.

2. The memory device of claim 1, wherein the information storage pattern comprises a charge storage layer and a blocking layer; and wherein said channel protective film extends between the charge storage layer and the protrusion and between the blocking layer and the protrusion.

3. The memory device of claim 2, wherein the information storage pattern comprises a tunnel insulation layer extending between the charge storage layer and the channel pattern; and wherein a portion of said channel protective film protrudes upward between a portion of tunnel insulation layer and a portion of the blocking layer and contacts the charge storage layer.

4. The memory device of claim 2, wherein an upper surface of the protrusion is convex relative to a bottom surface of said channel protective film.

5. The memory device of claim 2, wherein the channel protective film comprises an oxidized portion of said second source film.

6. The memory device of claim 1, wherein the information storage pattern comprises a tunnel insulation layer, a charge storage layer on the tunnel insulation layer, and a blocking layer on the charge storage layer; and wherein a portion of said channel protective film protrudes upward between a portion of charge storage layer and the first source film and contacts the blocking layer.

7. The memory device of claim 1, wherein the information storage pattern comprises a blocking layer on the upper stacked structure; and wherein said channel protective film extends between the blocking layer and the protrusion.

8. A memory device comprising:
a lower stacked structure formed on a substrate and including a first source film and a second source film disposed below the first source film;
an upper stacked structure disposed on the lower stacked structure; and
a channel structure configured to pass through the upper stacked structure and the first source film, and including a channel pattern configured to extend downward and an information storage pattern disposed outside the channel pattern,
wherein the second source film is formed below the information storage pattern and to be in direct contact with the channel pattern,
the second source film includes a protrusion configured to extend upward, and
a channel protective film is disposed on at least a portion of the protrusion and between the protrusion and the information storage pattern.

9. The memory device of claim 8, wherein the channel protective film is formed below a blocking layer and a charge storage layer of the information storage pattern.

10. The memory device of claim 9, wherein:
the channel protective film protrudes from a lower portion of the charge storage layer in a first direction; and
a lower end of the charge storage layer is located at a higher level than lower ends of the blocking layer of the information storage pattern.

11. The memory device of claim 9, wherein a lower end of the channel protective film includes a convex portion formed to be convex upward.

12. The memory device of claim 11, wherein:
upper and lower ends of the convex portion are located at a higher level than an upper end of the first source film; and
the channel protective film is a channel oxide film formed by oxidizing the second source film.

13. The memory device of claim 8, wherein:
the channel protective film is formed below a blocking layer, a charge storage layer, and a tunnel insulation layer of the information storage pattern; and
the channel protective film protrudes from a lower end of the blocking layer in a first direction.

14. The memory device of claim 13, wherein:
the channel protective film is a channel oxide film formed by oxidizing the second source film; and
an upper end of the channel oxide film is located at a higher level than an upper end of the first source film.

15. The memory device of claim 8, wherein the channel protective film is formed below a blocking layer of the information storage pattern.

16. The memory device of claim 8, wherein a lower end of the channel protective film is located at the same level as an upper end of the first source film or is located at a lower level than the upper end of the first source film.

17. The memory device of claim 8, wherein a peripheral region including a peripheral transistor is disposed below the substrate.

18. A memory device comprising:
a lower stacked structure formed on a substrate and including a first source film and a second source film disposed below the first source film;
an upper stacked structure disposed on the lower stacked structure; and
a channel structure passing through the upper stacked structure and the first source film and including a channel pattern configured to extend downward and an information storage pattern disposed outside the channel pattern,
wherein the second source film is formed below the information storage pattern and to be in direct contact with the channel pattern,
the second source film includes a protrusion configured to extend upward, a channel protective film is disposed between the protrusion and the information storage pattern,
the channel protective film is formed below a blocking layer and a charge storage layer of the information storage pattern,
a lower end of the channel protective film is located at the same level as a lower end of a tunnel insulation layer of the information storage pattern, and
an upper end of the protrusion is located at a lower level than an upper end of the first source film.

19. The memory device of claim 18, wherein the upper end of the protrusion is located at a level at which a distance from the upper end of the first source film is 150 Å or less.

20. The memory device of claim 18, wherein a peripheral region including a peripheral transistor is disposed below the substrate.

* * * * *